United States Patent
Takemura

(10) Patent No.: US 6,194,254 B1
(45) Date of Patent: *Feb. 27, 2001

(54) SEMICONDUCTOR DEVICE AND METHOD FOR MANUFACTURING THE SAME

(75) Inventor: Yasuhiko Takemura, Kanagawa (JP)

(73) Assignee: Semiconductor Energy Laboratories Co., Ltd., Kanagawa (JP)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

This patent is subject to a terminal disclaimer.

(21) Appl. No.: 08/828,710

(22) Filed: Mar. 28, 1997

Related U.S. Application Data

(62) Division of application No. 08/360,599, filed on Dec. 21, 1994, now Pat. No. 5,616,506, which is a division of application No. 08/294,740, filed on Aug. 23, 1994, now Pat. No. 5,534,716.

(30) Foreign Application Priority Data

Aug. 27, 1993 (JP) ..................................... 5-235461

(51) Int. Cl.[7] .......................... H01L 21/20; H01L 21/84; H01L 21/336
(52) U.S. Cl. ................... 438/166; 438/486; 438/487; 438/162; 438/982; 438/154
(58) Field of Search ............... 438/162, 30, 166, 438/154, 308, 486, 487, 795, 34, 164, 982

(56) References Cited

U.S. PATENT DOCUMENTS

Re. 33,321 * 9/1990 Magarino et al.
4,187,126   2/1980  Radd et al. .............................. 257/64
4,466,179   8/1984  Kasten .................................... 257/75
4,904,611   2/1990  Chiang et al. .......................... 437/21
4,933,298 * 6/1990  Hasegawa.

(List continued on next page.)

FOREIGN PATENT DOCUMENTS 0 178 447   4/1986  (EP).
61-84074    4/1986  (JP) ...................................... 257/64
2-140915    5/1990  (JP).
274634      4/1996  (TW).

OTHER PUBLICATIONS

"Crystallized Si Films By Low–Temperature Rapid Thermal Annealing of Amorphous Silicon", R. Kakkad, J. Smith, W.S. Lau, S.J. Fonash, J. Appl. Phys. 65 (5), Mar. 1, 1989, 1989 American Institute of Physics, pp. 2069–2072.

"Polycrystalline Silicon Thin Film Transistors on Corning 7059 Glass Substrates Using Short Time, Low Temperature Processing", G. Liu, S.J. Fonash, Appl. Phys. Lett. 62 (20), May 17, 1993, 1993 American Institute of Physics, pp. 2554–2556.

(List continued on next page.)

Primary Examiner—Mary Wilczewski
(74) Attorney, Agent, or Firm—Nixon Peabody LLP; Gerald J. Ferguson, Jr.; Jeffrey L. Costellia

(57) ABSTRACT

A silicon film is crystallized in a predetermined direction by selectively adding a metal element having a catalytic action for crystallizing an amorphous silicon and annealing. In manufacturing TFT using the crystallized silicon film, TFT provided such that the crystallization direction is roughly parallel to a current-flow between a source and a drain, and TFT provided such that the crystallization direction is roughly vertical to a current-flow between a source and a drain are manufactured. Therefore, TFT capable of conducting a high speed operation and TFT having a low leak current are formed on the same substrate.

38 Claims, 6 Drawing Sheets

U.S. PATENT DOCUMENTS

| | | | |
|---|---|---|---|
| 5,147,826 | 9/1992 | Liu et al. | 437/233 |
| 5,177,578 | 1/1993 | Kakinoki et al. | 257/64 |
| 5,275,851 | 1/1994 | Fonash et al. | 437/21 |
| 5,318,661 | 6/1994 | Kumomi . | |
| 5,323,042 | 6/1994 | Matsumoto | 257/72 |
| 5,341,012 | 8/1994 | Misawa et al. | 257/72 |
| 5,403,772 * | 4/1995 | Zhang et al. | 438/166 |
| 5,426,064 | 6/1995 | Zhang et al. . | |
| 5,481,121 * | 1/1996 | Zhang et al. | 257/64 |
| 5,488,000 | 1/1996 | Zhang et al. | 437/21 |
| 5,492,843 * | 2/1996 | Adachi et al. . | |
| 5,501,989 | 3/1996 | Takayama et al. | 437/21 |
| 5,508,533 * | 4/1996 | Takemura | 257/64 |
| 5,529,837 | 6/1996 | Zhang et al. | 437/21 |
| 5,529,937 * | 6/1996 | Zhang et al. . | |
| 5,534,716 | 7/1996 | Takemura . | |
| 5,543,352 * | 8/1996 | Ohtani et al. . | |
| 5,563,426 | 10/1996 | Zhang et al. . | |
| 5,569,610 * | 10/1996 | Zhang et al. | 438/166 |
| 5,569,936 | 10/1996 | Zhang et al. . | |
| 5,580,792 | 12/1996 | Zhang et al. . | |
| 5,585,291 * | 12/1996 | Ohtani et al. . | |
| 5,589,694 | 12/1996 | Takayama et al. . | |
| 5,595,923 | 1/1997 | Zhang et al. . | |
| 5,595,944 | 1/1997 | Zhang et al. . | |
| 5,604,360 | 2/1997 | Zhang et al. . | |
| 5,605,846 | 2/1997 | Ohtani et al. . | |
| 5,606,179 | 2/1997 | Yamazaki et al. . | |
| 5,608,232 * | 3/1997 | Yamazaki et al. | 257/66 |
| 5,612,250 * | 3/1997 | Ohtani et al. . | |
| 5,614,426 * | 3/1997 | Funada et al. | 438/30 |
| 5,614,733 * | 3/1997 | Zhang et al. | 257/66 |
| 5,616,506 | 4/1997 | Takemura . | |
| 5,620,910 | 4/1997 | Teramoto . | |
| 5,621,224 * | 4/1997 | Yamazaki et al. | 257/66 |
| 5,624,851 | 4/1997 | Takayama . | |
| 5,637,515 * | 6/1997 | Takemura | 438/162 |
| 5,639,698 * | 6/1997 | Yamazaki et al. | 438/166 |
| 5,643,826 * | 7/1997 | Ohtani et al. . | |
| 5,646,424 | 7/1997 | Zhang et al. . | |
| 5,654,203 | 8/1997 | Ohtani et al. . | |
| 5,656,825 | 8/1997 | Kusumoto et al. . | |
| 5,663,077 | 9/1997 | Adachi et al. . | |
| 5,677,549 | 10/1997 | Takayama et al. . | |
| 5,693,541 * | 12/1997 | Yamazaki et al. . | |
| 5,696,386 | 12/1997 | Yamazaki . | |
| 5,696,388 | 12/1997 | Funada et al. . | |
| 5,700,333 | 12/1997 | Yamazaki et al. . | |
| 5,705,829 * | 1/1998 | Miyanaga et al. | 257/66 |
| 5,712,191 * | 1/1998 | Nakajima et al. . | |
| 5,744,824 | 4/1998 | Kousai et al. . | |
| 5,808,321 | 9/1998 | Mitanaga et al. . | |
| 5,818,076 * | 10/1998 | Zhang et al. | 257/255 |
| 5,824,573 * | 10/1998 | Zhang et al. | 438/150 |
| 5,830,784 * | 11/1998 | Zhang et al. | 438/154 |

OTHER PUBLICATIONS

"Selective Area Crystallization of Amorphous Silicon by Low–temperature Rapid Thermal Annealing", Gang Liu and S.J. Fonash, Appl. Physics Lett. 55 (7), Aug. 14, 1989, 1989 American Institute of Physics, pp. 660–662.

"Low Temperature Selective Crystallization of Amorphous Silicon", R. Kakkad, G. Liu, S.J. Fonash, Journal of Non–Crystalline Solids, vol. 115, (1989), pp. 66–68.

C. Hayzelden et al., "In Situ Transmission Electron Microscopy Studies of Silicide–Mediated Crystallization of Amorphous Silicon" (3 pages), Appl. Phys. Lett., 1992.

T. Hempel et al., "Needle–Like Crystallization of Ni Doped Amorphous Silicon Thin Films", *Solid state Communications*, vol. 85, No. 11, pp. 921–924, 1993.

A.V. Dvurechenskii et al., "Transport Phenomena in Amorphous Silicon Doped by Ion Implantation of 3d Metals", Akademikian Lavrentev Prospekt 13, USSR, pp. 635–640, Phys. Stat. sol. (9) 95,635 (1986).

* cited by examiner

US 6,194,254 B1

SEMICONDUCTOR DEVICE AND METHOD FOR MANUFACTURING THE SAME

This is a Divisional application of Ser. No. 08/360,599, filed Dec. 21, 1994, now U.S. Pat. No. 5,616,506; which itself is a division of Ser. No. 08/294,740, filed Aug. 23, 1994, now U.S. Pat. No. 5,534,176.

BACKGROUND OF THE INVENTION

1. Field of the Invention

The present invention relates to a semiconductor device using a thin film transistor (TFT) mounted on an insulating substrate such as a glass plate, and more particularly to a semiconductor device which can be utilized in an active matrix type liquid crystal displaying unit, or the similar matrix circuit.

2. Description of the Related Art

An active matrix type liquid crystal display unit using a TFT to drive a pixel, an image sensor, a three dimensional integrated circuit, and the like are known as a semiconductor device having a TFT on an insulating substrate such as a glass plate.

A thin film silicon semiconductor is generally used as the TFT mounted on such a device. In particular, for a high speed operation it is strongly required to establish a method for manufacturing a TFT comprising a crystalline silicon semiconductor. A method of conducting crystallization by forming an amorphous semiconductor film and applying a heat energy thereto (heat annealing) is known as a method for obtaining such a crystalline thin film silicon semiconductor.

There are some problems in manufacturing a semiconductor circuit using the crystalline silicon film thus formed. For example, a circuit that not only a matrix circuit but also the peripheral circuit for driving the same are constituted of the TFT (monolithic type active matrix circuit) is taken into account as an active matrix type circuit used in a liquid crystal display unit (i.e., a circuit that a controlling transistor is arranged in each pixel).

In this complicated circuit, characteristics required in the TFT vary depending on the position of the circuit. For example, the TFT used for controlling the pixel of the active matrix circuit is required to have sufficiently small leak current in order to maintain an electric charge stored in a capacitor constituted of a pixel electrode and an opposite electrode. However, a current driving ability may not be so high.

On the other hand, a large current switching at a short time is necessary in the TFT used in a driver circuit which supplies signals to a matrix circuit, and the TFT having a high current driving ability is required. However, a leak current may not be so low.

A TFT having a high current driving ability and a low leak current is most desirable. However, the TFT presently manufactured is far from such an ideal TFT, and if the current driving ability is high, the leak current is also high, and if the leak current is low, the current driving ability is low.

Therefore, the monolithic type active matrix circuit constituted using the conventional TFT attempts to improve the current driving ability and reduce the leak current by changing a channel length or a channel width of the TFT. However, if the circuit becomes finer, the change by a scale as conventionally employed is limited.

For example, in order to obtain a high current driving ability it is necessary to increase the channel width. The monolithic circuit uses the TFT having a channel width of 500 to 1,000 μm. However, if a higher current driving ability is required due to the increase in the number of pixels and the degree of gradation, it is difficult to further expand the channel width to 5 mm, 10 mm or the like from that the formation region of the peripheral circuit is limited.

On the other hand, it is desirable for the TFT used to control the pixel to obtain a clear image quality by increasing a charge retention ability. However, considering that the pixel region has a size of several hundreds μm square, it is impossible to increase the channel length to 50 μm, 100 μm or the like in order to decrease the leak current. As s result, since a scale of a matrix, a pitch and the number of pixels are largely limited in the conventional TFT monolithic type active matrix circuit, a displaying unit having a finer screen capable of obtaining a high quality image cannot be manufactured.

The above problems occur in not only the monolithic type active matrix circuit but also in other semiconductor circuits.

SUMMARY OF THE INVENTION

An object of the present invention is to overcome the problems and further improve the characteristics of a circuit as a whole.

The present inventor has confirmed that some metal elements are effective to promote crystallization of an amorphous silicon film. The elements which promote the crystallization are Group VIII elements such as Fe, Co, Ni, Ru, Rh, Pd, Os, Ir and Pt, 3d elements such as Sc, Ti, V, Cr, Mn, Cu and Zn, noble metal such as Au and Ag, and the like. Among the above, Ni, Cu, Pd and Pt have a large crystallization promoting effect. By adding those metal elements to the amorphous silicon film, the crystallization temperature can be lowered, whereby a time required for the crystallization can be shortened.

A method for adding the metal elements includes a method for forming the above-described metal element film or a thin film containing the metal element in contact with the upper or lower side of the amorphous silicon film. Further, it is confirmed that if the metal element is introduced by an ion implantation, substantially same effect is obtained. For example, it is confirmed that it is possible to lower the crystallization temperature in addition of nickel in an amount of $1\times10^{15}$ atoms/cm$^3$ or more.

The amount of the metal element added varies depending on the type of the metal element. If nickel is used, it is desired that the amount thereof is in the concentration range of from $1\times10^{17}$ to $1\times10^{20}$ atoms/cm$^3$. If the concentration of nickel is more than $5\times10^{20}$ atoms/cm$^3$, nickel silicide is formed locally, resulting in deterioration of characteristics as the semiconductor. Further, if the concentration of nickel is less than $1\times10^{17}$ atoms/cm$^3$, the effect of nickel as a catalyst is decreased. A reliability as the semiconductor becomes high as the nickel concentration decreases.

Thus, it becomes apparent that the crystallization can be promoted by adding specific metal elements to the silicon film. In addition, it is confirmed that by selectively adding those metal elements to the silicon film, a crystal growth selectively generates from a region to which the metal element has been added, and the crystal growth region expands into its periphery. Further, according to more detailed observations, needle crystals are growing in the direction along the substrate surface not in the direction in the thickness of the substrate, in the silicon film to which those metal elements have been added.

A crystal grows in a needle form in the silicon film to which those metal elements have been added. The width (length) thereof is about 0.5 to 3 times the thickness of the silicon film, and a growth in a transverse direction (a side direction of the crystal) is small. For this reason, a grain boundary is formed in parallel to the crystal growth direction. Where nickel is used as the metal element, the crystal grows in the (111) direction. An example of this crystal growth is shown in FIGS. 1A to 1C.

FIG. 1A is a top view, showing a state that a crystal growth generates from the region to which a metal element has selectively been added. Region 2 is a silicon film region to which the metal element has been added and the crystal growth expands from the region 2 to the periphery. Ellipse region 3 is region crystal-grown in a transverse direction. Arrows show the direction of the crystal growth. An outer region 1 outside the region 2 is a region which is not crystallized.

FIG. 1B is an enlarged view of a part of the region 3, for example, a square region 4. As is apparent from FIG. 1B, grain boundaries 6 and 7 generate in parallel to the direction of crystal growth (B to C) in the silicon film 5. Therefore, the grain boundary is less in a cross section (face BC) which is in parallel to the direction of the crystal growth, but many grain boundaries are observed in a cross section (face BA) which is vertical to the direction of the crystal growth.

In a case wherein such a film is oxidized by a thermal oxidation method, the thermal oxidation which can be employed includes a method of conducting a general thermal anneal in an oxidizing atmosphere (atmosphere of oxygen, ozone, nitrogen oxide, or the like), and a method of treating the surface of the silicon film at high temperature for a short period of time in an oxidizing atmosphere, as represented by a rapid thermal anneal (RTA) method.

The thermal oxidization proceeds along the amorphous silicon component-rich grain boundary. Therefore, as shown in FIG. 1C, an interface 9 between a silicon oxide layer 8 and the silicon film is markedly waved (uneven) in the face BA vertical to the direction of the crystal growth. However, the interface 9 is very smooth in the face BC which is in parallel to the direction of the crystal growth.

The above difference greatly affects the electric current flow on the surface of the silicon film. That is, a current flow is prevented by the unevenness of the interface 9 in the BA direction. On the other hand, a current flow is very smooth in the BC direction. For this reason, assuming that a direction to which a source/drain current flows in an insulating gate type field effect transistor which controls a current flowing a surface is the BA direction, the current flows as shown in a line 11 and the leak current is decreased by a substantial increase in the channel length. On the other hand, assuming that the source/drain current flowing direction is the BC direction, since there is no substantial barrier (grain boundary or the like), the current flows as shown in a line 10 and a mobility of this transistor becomes large. In particular, in order to sufficiently reduce the leak current in the BA direction as compared with the leak current in BC direction, it is desirable that the thickness of the thermal oxide film is 50 Å or more.

In particular, where an amorphous component is present in a crystalline silicon film, since the rate of oxidation is large in the amorphous component, an oxide film formed in a portion that the amorphous component is present (mainly, the vicinity of grain boundary) is thicker than that in the other portion. Therefore, where the unevenness of the silicon oxide film is considerably larger than the thickness of the gate insulating film, typically where the unevenness is 10% or more the thickness of the gate insulating film, an anisotropy on easiness of the current flow becomes remarkable.

By oxidizing the surface of the crystalline silicon film having the above anisotropy, and appropriately controlling the direction of the source/drain current of the silicon film, transistors having markedly different characteristics can be formed on the same substrate, and can also be formed adjacently. In actual transistors only the thermal oxide film is sometimes insufficient as the gate insulating film. In this case, an insulating film is further formed on the thermal oxide film by employing the conventional physical vapor deposition method (PVD method) or chemical vapor deposition method (CVD method).

As described above, the present invention is characterized in that (1) a metal element which promotes crystal growth of an amorphous silicon is selectively added to an amorphous silicon film, (2) a crystal growth having a directionality is conducted, (3) the crystallized silicon film is thermally oxidized, and (4) a TFT active layer is arranged such that an angle formed between a source/drain current direction and a crystallization direction has a predetermined angle $\alpha$. Furthermore, a plurality of TFTs each having different angle $\alpha$ are manufactured on the same substrate. Typically, various circuits can be constituted by using two kinds of TFT in the case of $\alpha$=about 0 (the crystal growth direction approximately coincides with the source/drain current direction (carrier moving direction) or the crystal growth direction is approximately parallel to the source/drain current direction) and in the case of $\alpha$=about 90° (the crystal growth direction is approximately vertical to the source/drain current direction).

For example, in the active matrix type liquid crystal display, the required characteristics differ between the TFT of the peripheral circuit and the TFT of the pixel portion. That is, it is necessary in the TFT which form a driver of the peripheral circuit to have a high mobility and flow a large on-current. On the other hand, in the TFT provided on the pixel portion, the mobility may not be high in order to increase a charge retentivity, but it is required that the leak current (off-current) is small.

The present invention uses a crystalline silicon film crystal-grown in the direction parallel to the substrate. In the TFT used in the peripheral circuit, the source/drain region is constituted in the direction parallel to the crystal growth direction. In the TFT used in the pixel, the source/drain region is constituted in the direction vertical to the crystal growth direction. That is, the TFT used in the peripheral circuit is constituted so as not to be influenced to the utmost by the grain boundary and the unevenness in the silicon film/silicon oxide film interface when a carrier moves. Moreover, the TFT used in the pixel is constituted so as to transverse the grain boundary when the carrier moves. By this constitution, a resistance between the source and the drain is high, and as a result, the leak current (off-current) is decreased.

Thermal oxidation is conducted to change the amorphous portion to a silicon oxide, the silicon oxide is etched with a buffer hydrofluoric acid and the like. This removes silicon oxide, thereby increasing a degree of the unevenness on the silicon surface. Subsequently, by further thermal oxidization, the unevenness in the silicon film/silicon oxide film interface can be further increased. Because an oxidation speed of the amorphous silicon is about 2 to 3 times that of the crystalline silicon, and the degree of the unevenness is further increased. As a result, difference on easiness of a current flow is further increased by an angle to the crystal growth direction.

The present invention can obtain the TFT having necessary characteristics by utilizing that the carrier flows between source/drain, and by making the source/drain direction (direction of line connecting the source and the drain) parallel or vertical to the crystal growth direction. That is, a TFT having a high mobility or a TFT having a small off-current is obtained by moving the carrier to the direction parallel to the grain boundary of the crystals grown in a needle form or a columnar form (direction parallel to the crystal growth direction), or the direction vertical to the grain boundary of the crystals grown in a needle form or a columnar form (direction vertical to the crystal growth direction).

Where the TFT is constituted using the crystalline silicon film crystal-grown in a direction parallel to the substrate surface, the TFT which has a high mobility and not so much influence of the grain boundary and the unevenness in the silicon film/silicon oxide film interface can be obtained by forming the source/drain region along the crystal growth direction. Further, the TFT which is affected by the grain boundary and the unevenness in the silicon film/silicon oxide film interface and therefore has a small off-current can be obtained by forming the source/drain region in the direction vertical to the crystal growth direction. The above TFT can be manufactured by optionally determining the direction of the carrier which moves between the source/drain, relative to the crystal growth direction.

FIG. 2 shows the embodiment manufacturing two kinds of TFT on a crystalline silicon region 14. The region 14 is a part of the ellipse crystalline silicon region 13 obtained by enlarging a rectangular region 12 to the periphery thereof. The crystal growth direction is indicated by an arrow 14a. The TFTs formed on the region 14 are TFT1 (source/drain regions 1a and 1c, and a channel formation region 1b) in which the source/drain direction is vertical to the crystal growth direction, and TFT2 (source/drain regions 2a and 2c, and a channel formation region 2b) in which the source/drain direction is parallel to the crystal growth direction. Typical characteristics of TFT1 and TFT2 are shown in FIG. 3. The on-current or off-current of TFT1 is small as compared with TFT2. For example, the off-current of TFT1 is typically 0.5 to 2 orders smaller than TFT2. Further, the on-current and the mobility of TFT2 is typically 10 to 30% large as compared with TFT1.

Therefore, if TFT1 is used in a pixel transistor of the monolithic type active matrix circuit and TFT2 is used in a driver transistor of the peripheral circuit, the characteristics of the active matrix circuit as a whole can further be improved.

DETAILED DESCRIPTION OF THE PREFERRED EMBODIMENTS

[Embodiment 1]

Figure 1A:
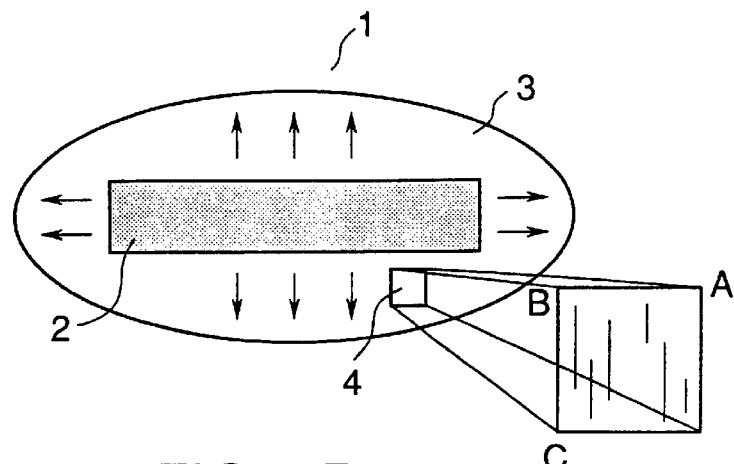
FIGS. 1A to 1C are top views showing the state that the crystal growth selectively generates from the region to which a metal element has been added.
Figure 1B:
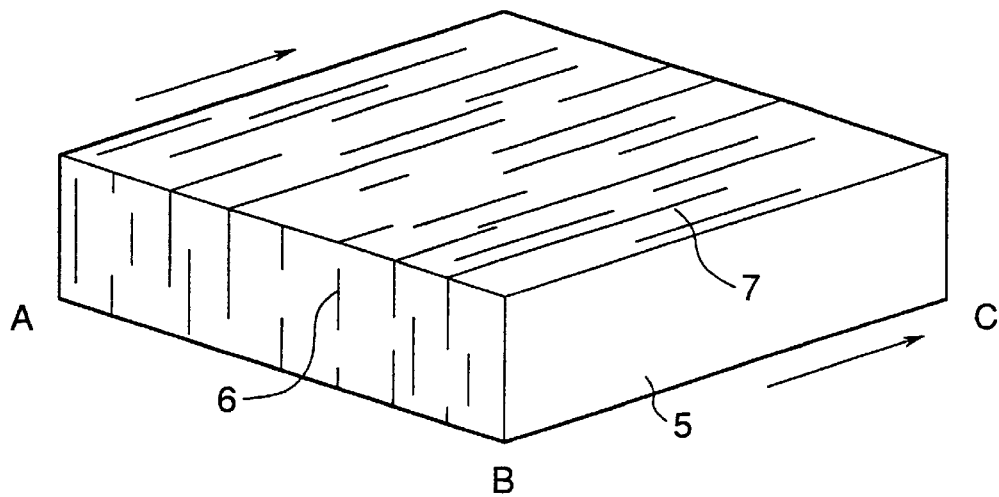
Figure 1C:
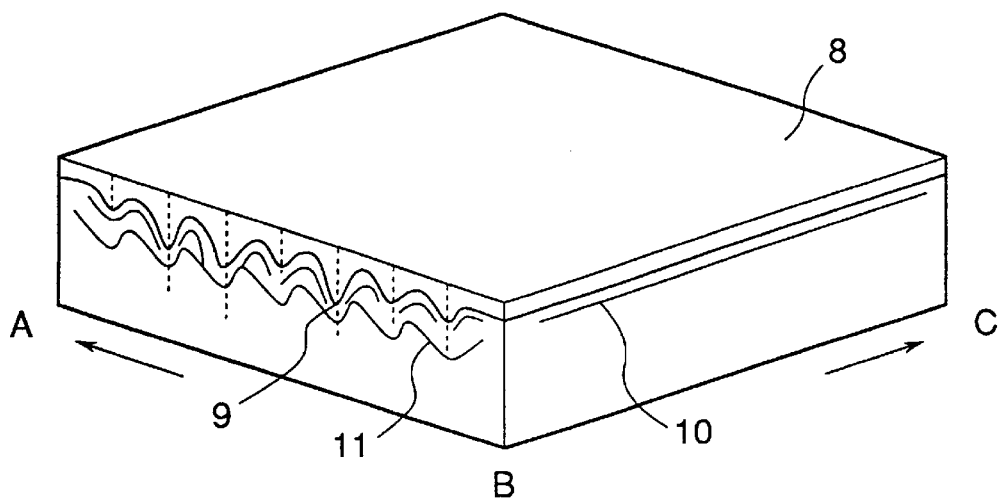
Figure 2:
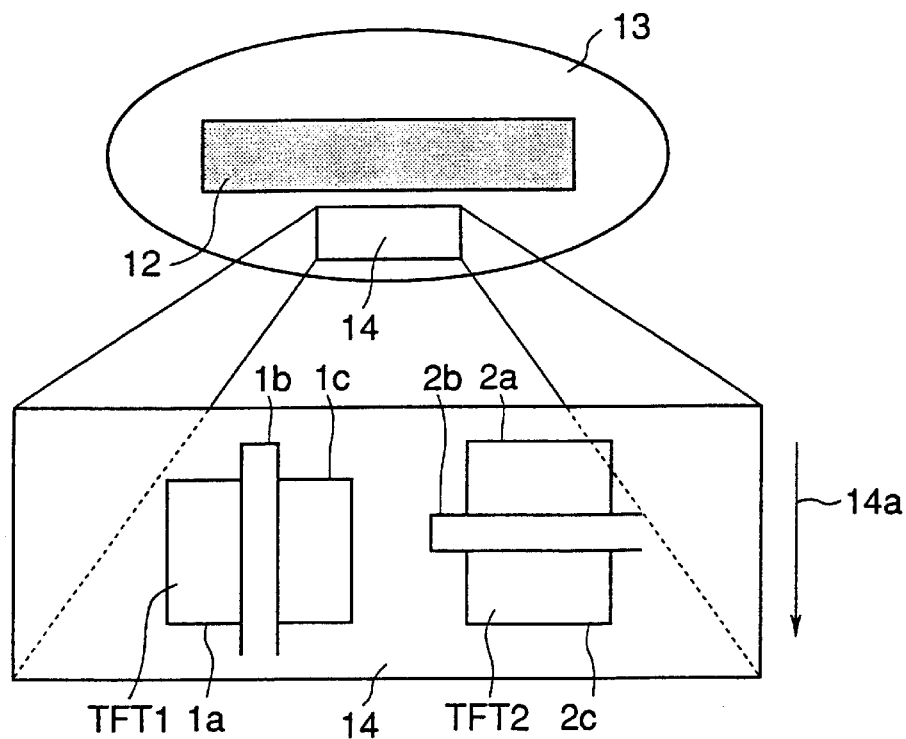
FIG. 2 is a view showing the embodiment of manufacturing two kinds of TFTs on the crystalline silicon region.
Figure 3:
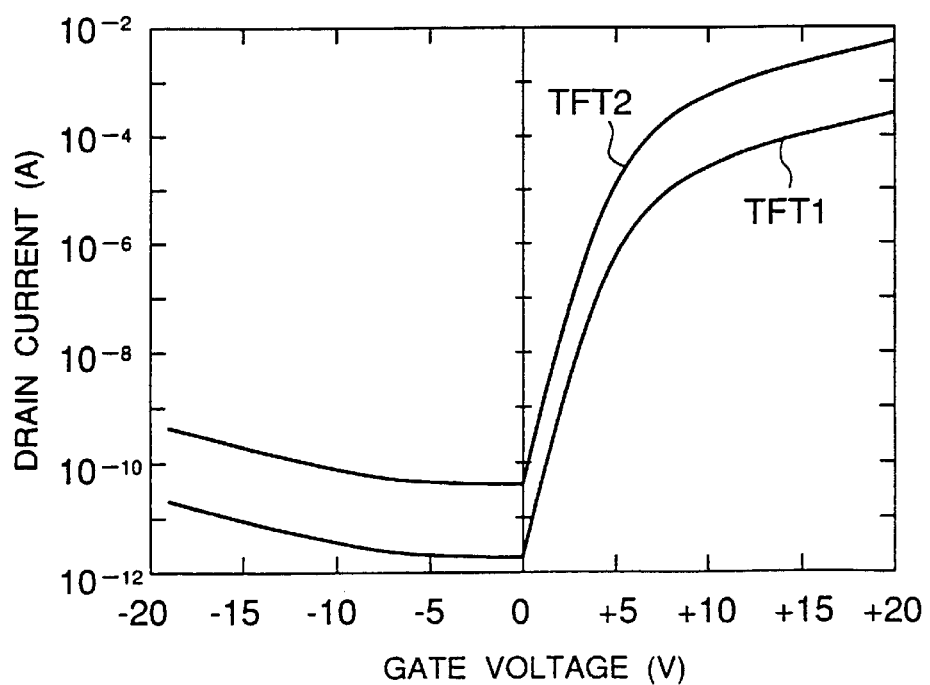
FIG. 3 is a view showing typical characteristics of the TFTs shown in FIG. 2.

The manufacturing steps of a peripheral circuit having NTFT and PTFT which are constituted in a complementary form, and a circuit having NTFT used in a pixel transistor, according to the present invention are shown in FIGS. 4A to 4F and FIGS. 5A to 5C.

A silicon oxide base film 102 having a thickness of 2,000 Å is formed on a substrate (Corning 7059) 101 by a sputtering method. The substrate 101 is annealed at the temperature higher than its strain temperature before or after formation of the base film 102, and then gradually cooled down to the strain temperature at a rate of 0.1 to 1.0° C./min. As a result, contraction of the substrate becomes small in the subsequent steps involving a temperature elevation (including an oxidation step by ultraviolet ray irradiation and thermal annealing), thereby mask matching easily. The substrate 101 is annealed at 620 to 660° C. for 1 to 4 hours and then gradually cooled at a rate of 0.1 to 1.0° C./min, and preferably 0.1 to 0.3° C./min. When the temperature reaches 450 to 590° C., the substrate 101 is taken out of a chamber.

An amorphous silicon film 103 having a thickness of 300 to 800 Å is formed by a plasma CVD method. Further, a nickel film 105 having a thickness of 20 to 50 Å is formed by a sputtering method using a mask 104 of silicon oxide having a thickness of 1,000 to 3,000 Å, for example, 2,000 Å. The nickel film 105 may not be a continuous film.

Figure 4A:
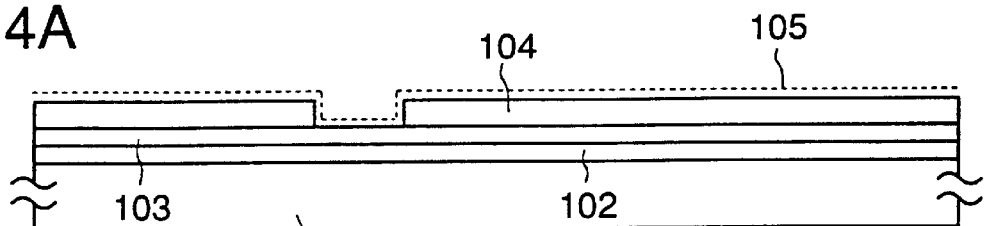
FIGS. 4A to 4F and FIGS. 5A to 5C are views showing the manufacturing steps of a peripheral circuit having NTFT and PTFT which are constituted in a complementary form, and a circuit having NTFT used in a pixel transistor, according to the present invention.
Figure 4B:
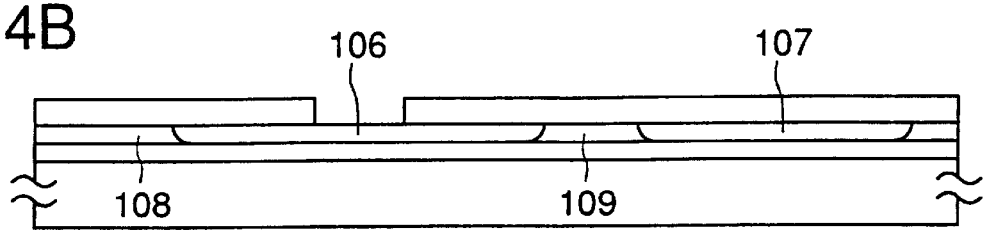
Figure 5A:
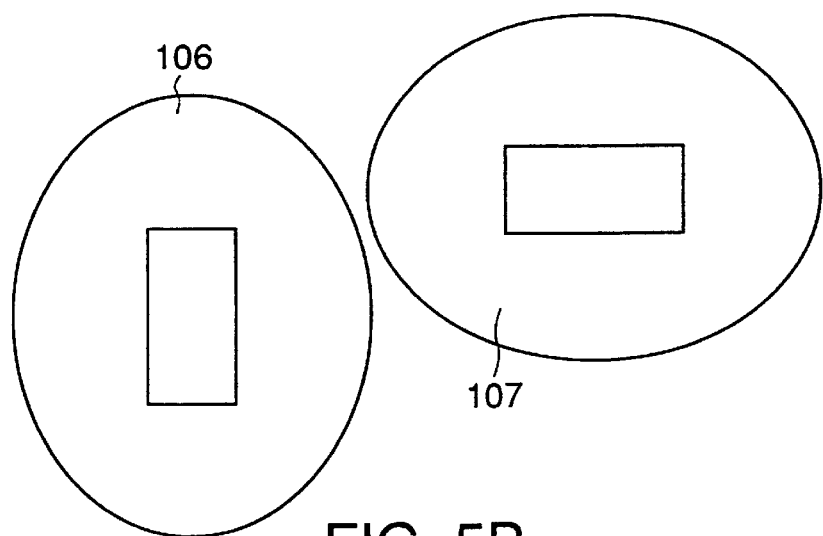

Thereafter, a heat annealing is conducted in a nitrogen atmosphere at 500 to 620° C., for example, at 550° C. for 8 hours, or at 600° C. for 4 hours, to crystallize the silicon film 103. The crystal growth proceeds in the direction parallel to the substrate from the region at which the nickel film 105 is in contact with the silicon film 103, as the starting position. In FIG. 4B, regions 106 and 107 each are a crystallized region, and regions 108 and 109 each are a non-crystallized region, i.e., a region of the amorphous silicon. FIG. 5A is a view showing the above state seen from the upper side.

Figure 4C:
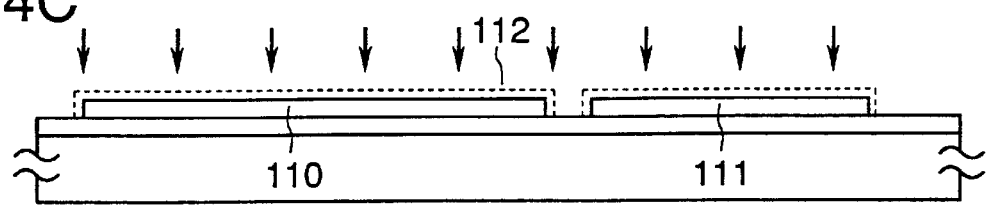

The silicon film 103 is subjected to patterning to for island-like active layer regions 110 (complementary type circuit region) and 111 (pixel transistor region) as shown in FIG. 4C. In FIG. 5A, a rectangular region positioned at the center of the ellipse is a region into which nickel is directly introduced (added), and is a region in which nickel is present at high concentration. A high concentration nickel also presents at the tip (end) portion of the crystal growth of the regions 106 and 107. Those regions have a nickel concentration about one order higher than that in the crystallized region.

Therefore, it is necessary that the active layer regions 110 and 111, particularly the channel forming region, are arranged in a region other than the region having a high nickel concentration. Etching of the active layer region is conducted by a reactive ion etching (RIE) method having an anisotropy in a vertical direction. The nickel concentration in the active layer region is about $10^{17}$ to $10^{20}$ atoms/cm$^3$.

Oxidation of the active layer region is conducted by a rapid thermal annealing method. Specifically, an infrared light having a peak at 0.6 to 4 μm, 0.8 to 1.4 μm in this embodiment, is irradiated in an oxidizing atmosphere for 30 to 180 seconds to form a thin silicon oxide film 112 on the surface of the active layers 110 and 111. In addition, 0.1 to 10% of HCl may be added to the atmosphere.

A halogen lamp is used as a light source for an infrared light. An intensity of the infrared light is adjusted such that a temperature of a single crystal silicon wafer used as a monitor is 900 to 1,200° C. Specifically, a temperature of a thermocouple embedded in the silicon wafer is monitored and the monitored temperature is feed back to a unit which controls the light source of the infrared ray. In this embodiment, the temperature increase rate is 50 to 200° C./sec in constant, and the temperature decrease rate is 20 to 100° C./sec in natural cooling. The infrared light irradiation may be conducted from the state that the substrate is maintained at the room temperature. To further increase the effect, it is preferred to heat in advance the substrate to 200 to 450° C., for example, 400° C.

Since the silicon film is selectively heated by this infrared light irradiation, the heating to the glass substrate can be minimized. It is also very effective to decrease defects or dangling bond in the silicon film. The silicon oxide 112 formed by this infrared light irradiation has a thickness of 50 to 150 Å.

Figure 4D:
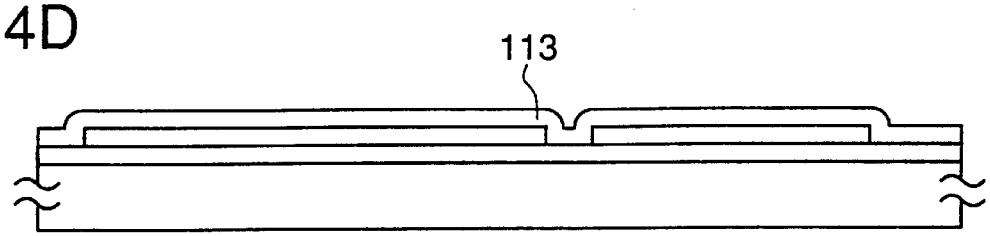

The silicon oxide film 113 having a thickness of 1,000 Å is formed as a gate insulating film by a sputtering method (FIG. 4D). Silicon oxide is used as a target in the sputtering. The substrate temperature at the sputtering is 200 to 400° C., for example, 350° C. The sputtering atmosphere contains oxygen and argon, and argon/oxygen=0 to 0.5, for example, 0.1 or less.

Figure 4E:
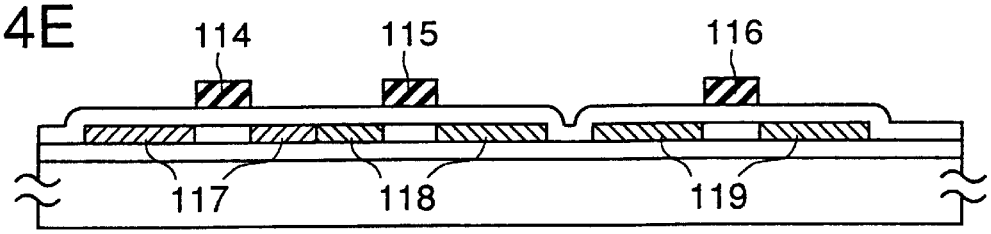
Figure 5B:
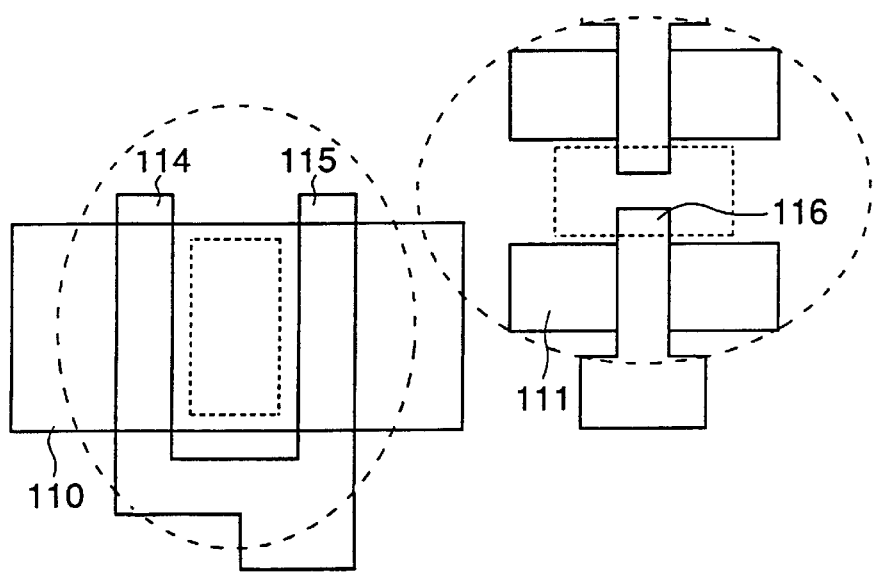

The silicon film (containing 0.1 to 2% of phosphorus) having a thickness of 3,000 to 8,000 Å, for example, 6,000 Å is formed by a low pressure CVD method. It is desirable that the formation step of the silicon oxide film 113 and the formation step of the silicon film are continuously conducted. Gate electrodes 114 to 116 are formed by patterning of the silicon film (FIG. 4E). FIG. 5B is a top view showing the above state. An ellipses shown in broken lines correspond to the regions 106 and 107 in FIG. 5A.

Impurities (phosphorus and boron) are doped (implanted) into the active layer using the gate electrodes 114 to 116 as masks by an ion doping method. Phosphine ($PH_3$) and diborane ($B_2H_6$) are used as a doping gas. Where phosphine is used, an accelerating voltage is 60 to 90 KV, for example, 80 KV, and where diborane is used, the accelerating voltage is 40 to 80 KV, for example, 65 KV. The dose is $1 \times 10^{15}$ to $8 \times 10^{15}$ cm$^{-2}$, and for example, the dose is $2 \times 10^{15}$ cm$^{-2}$ in the case of phosphorus, and the dose is $5 \times 10^{15}$ cm$^{-2}$ in the case of boron. In doping, a doping unnecessary region is covered with a photoresist, and the respective elements are selectively doped in the desired region. As a result, N type impurity regions 118 and 119, and P type impurity region are formed.

Annealing is conducted by a laser light irradiation, and the impurities are activated. KrF excimer laser (wavelength 248 nm, pulse width 20 nsec) is used as the laser light, but other laser lights may be used. The irradiation conditions are such that an energy density is 200 to 400 mJ/cm$^2$, for example, 250 mJ/cm$^2$, and a shot number per portion is 2 to 10 shots, for example, 2 shots. It is advantageous to heat the substrate at about 200 to 450° C. at the laser light irradiation. In the laser annealing step, since nickel is dispersed in the previously crystallized region, recrystallization easily proceeds by the laser light irradiation. Therefore, the impurity region 117 in which the impurity for providing a P conductive type is doped, and the impurity regions 118 and 119 in which the impurity for providing an N conductive type is doped, are easily activated.

Figure 4F:
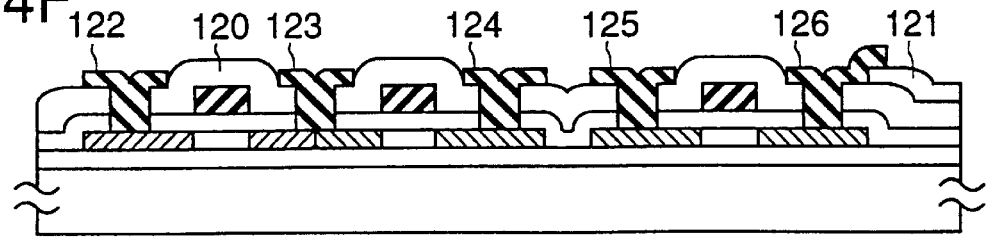
Figure 5C:
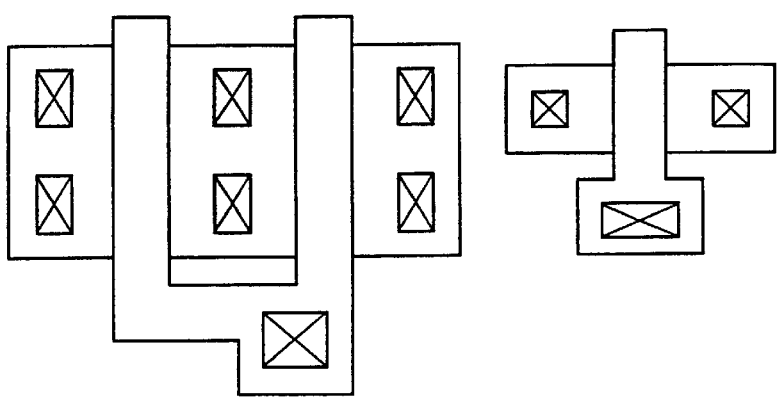

As shown in FIG. 4F, a silicon oxide film 120 having a thickness of 6,000 Å is formed as an interlayer insulating material by a plasma CVD method. Further, ITO (indium tin oxide) film having a thickness of 500 Å is formed by a sputtering method, and a pixel electrode 121 is formed by patterning the ITO film. Contact holes (the opening position is shown in FIG. 5C) are formed in the interlayer insulating material 120, and wiring/electrodes 122 to 126 of TFTs are formed by a metallic material, such as a multilayer film of titanium nitride and aluminum. Finally, annealing is conducted at 350° C. for 30 minutes in a hydrogen atmosphere of 1 atm, whereby a TFT circuit is completed.

As is apparent from FIG. 5B, the source/drain direction in the active layer 110 is parallel to the crystallization direction, and the source/drain direction in the active layer 111 are vertical to the crystallization direction. As a result, the TFT formed in the active layer 110 has a large on-current. On the other hand, the TFT formed in the active layer 111 has a small off-current. In this embodiment, although two types of TFT having different characteristics are formed on the relatively adjacent position, it is possible to form such TFTs on the places very far from each other as in the active matrix circuit.

[Embodiment 2]

FIGS. 6A to 6F are views showing the other manufacturing steps (sectional views) according to the present invention. A base film 202 of silicon oxide having a thickness of 2,000 Å is formed on a substrate (Corning 7059) 201 by a plasma CVD method using tetraethoxysilane (TEOS) and oxygen as raw materials. After formation of the base film 202, annealing is conducted at 620 to 660° C. for 1 to 4 hours. Thereafter, the substrate is gradually cooled at 0.1 to 1.0° C./min, preferably 0.1 to 0.3° C./min, and when the temperature reaches 450 to 590° C., the substrate is taken out of a chamber.

Figure 6A:
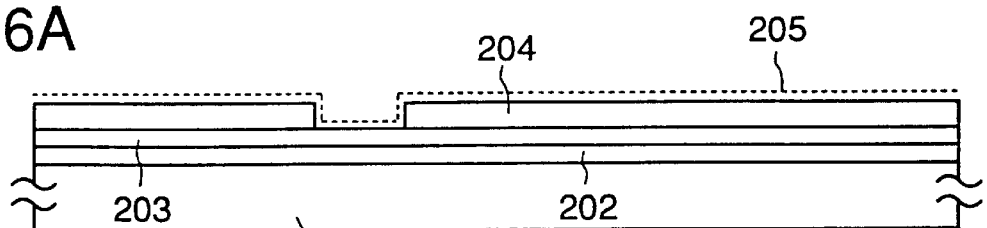
FIGS. 6A to 6F are views showing other manufacturing steps according to the present invention.

An amorphous silicon film 203 having a thickness of 300 to 800 Å is formed by a plasma CVD method. A nickel film 205 having a thickness of 20 to 50 Å is formed using a mask of silicon oxide having a thickness of 1,000 to 3,000 Å, for example, 2,000 Å by a sputtering method. The nickel film may not be a continuous film (FIG. 6A).

Figure 6B:
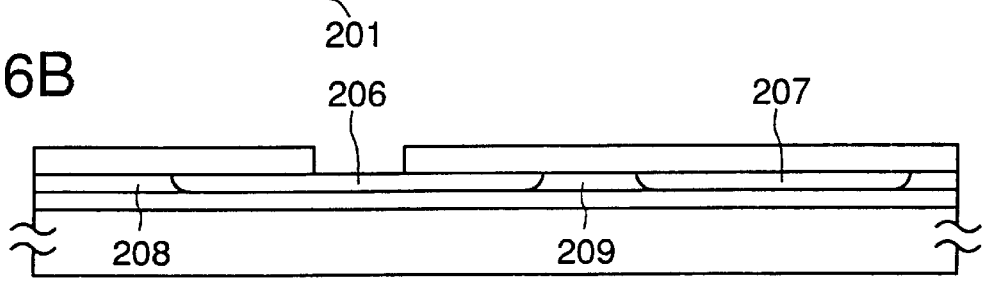

Thereafter, thermal annealing is conducted at 500 to 620° C., for example, 600° C., for 4 hours in a nitrogen atmosphere to crystallize the silicon film 203. The crystal growth proceeds in the direction parallel to the substrate from a region that the nickel film and the silicon film are contacted, as the starting position. In FIG. 6B, regions 206 and 207 are a region crystallized by this step, and regions 208 and 209 are an amorphous silicon region.

Next, the silicon film 203 is subjected to patterning to form island-like active layer regions 210 (complementary type circuit region) and 211 (pixel transistor region). Etching of the active layer regions is conducted by the RIE method having an anisotropy to a vertical direction.

Then a rapid thermal annealing (RTA) treatment is conducted to further increase a crystallinity of the active layer. Specifically, an infrared light having a peak at 0.6 to 4.0 μm, 0.8 to 1.4 μm in this embodiment, is irradiated for 30 to 180 seconds. 0.1 to 10% of HCl may be added to the atmosphere.

A halogen lamp is used as a light source for infrared light. An intensity of the infrared light is adjusted such that the temperature of a single crystal silicon wafer used as a monitor becomes 900 to 1,200° C. Specifically, the temperature of a thermocouple embedded in the silicon wafer is monitored, and the monitored temperature is feed back to a unit which controls the light source of the infrared light. In this embodiment, the temperature increase rate is 50 to 200° C./sec in constant, the temperature decrease rate is 20 to 100° C./sec in natural cooling. The infrared light irradiation may be conducted from the state that the substrate is maintained in the room temperature. To further increase the effect, it is advantageous to previously heat the substrate to 200 to 450° C., for example, 400° C.

Since the silicon film is selectively heated by this infrared light irradiation, heating to the glass plate can be minimized. Further, it is effective to decrease defects and dangling bond of the non-crystallized region in the silicon film.

Figure 6C:
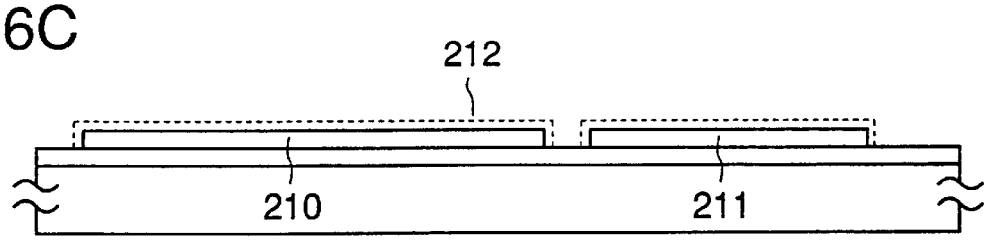

The substrate is annealed at 550 to 650° C., typically 600° C., for 1 hour in a dry oxygen atmosphere. It is necessary to select the annealing temperature not to affect the substrate. As a result, a thermal oxide film 212 having a thickness of 20 to 200 Å, typically 40 to 100 Å, is formed on the surface of the active layer. If oxidation is conducted in this step at 550 to 650° C. in a state that water is contained in the oxygen atmosphere by a pyrogenic oxidization method or the like, the silicon oxide film having a thickness of 500 to 800 Å is obtained (FIG. 6C).

Figure 6D:
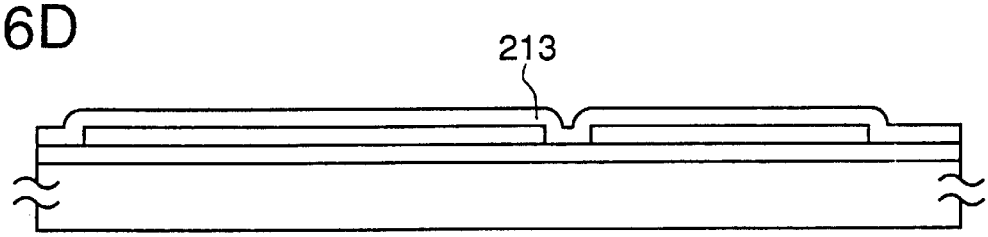

A silicon oxide film 213 having a thickness of 1,000 Å is formed as a gate insulating film by a plasma CVD method using TEOS and oxygen. The substrate temperature at the film formation is 200 to 400° C., for example, 350° C. Trichloroethylene (TCE) is added in an amount of 1 to 50%, typically 20% per TEOS. Chlorine is introduced into the gate insulating film by TCE, and a mobile ion (such as sodium) contained in the active layer is removed, whereby characteristics are further increased. After this step, thermal annealing may be conducted at 550 to 650° C. in nitrogen or dinitrogen oxide (FIG. 6D).

An aluminum film (containing 0.1 to 2% of scandium) having a thickness of 3,000 to 8,000 Å, for example, 6,000 Å, is formed by a sputtering method. This aluminum film is subjected to patterning to form gate electrodes 214 to 216. Anodization is conducted by passing current through the gate electrode in an electrolyte, and an aluminum oxide film having a thickness of 1,000 to 3,000 Å, 2,000 Å in this embodiment, is formed on the upper and side surface of the gate electrode. This anodization is conducted in an ethylene glycol solution containing 1 to 5% of tartaric acid. Since this aluminum oxide film is used as an off-set gate region in the subsequent ion doping step, a length of the off-set region can be determined by the anodization step.

Impurities for providing P or N conductive type in self-alignment are added to the active layer region (source/drain, channel region) by an ion doping method (plasma doping method) using a gate electrode portion (i.e., the gate electrode and the peripheral oxide layer) as a mask. Phosphine ($PH_3$) and diborane ($B_2H_6$) are used as a doping gas. The accelerating voltage is 60 to 90 KV, for example, 80 KV, where phosphine is used, and 40 to 80 kV, for example, 65 kV, where diborane is used. The dose is $1 \times 10^{15}$ to $8 \times 10^{15}$ $cm^{-2}$, and for example, phosphorus is $5 \times 10^{15}$ $cm^{-2}$ and boron is $2 \times 10^{15}$ $cm^{-2}$. In doping, by covering one region by a photoresist, the respective element are selectively doped in the other regions. As a result, N type impurity regions 218 and 219, and P type impurity region 217 are formed, and a region of a P channel type TFT(PTFT) and a region of an N channel type TFT(NTFP) can be formed.

Figure 6E:
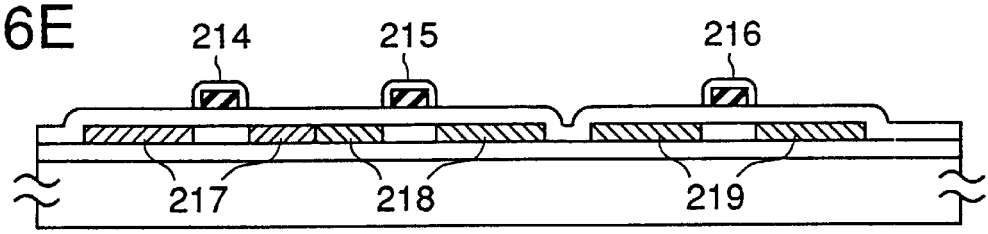

Annealing is conducted by a laser light irradiation to activate the impurities ion implanted. KrF excimer laser (wavelength 248 nm, pulse width 20 nsec) is used as a laser light, but other laser may be used. Irradiation conditions of the laser light are such that an energy density is 200 to 400 $mJ/cm^2$, for example, 250 $mJ/cm^2$, and a number of shots per one portion is 2 to 10 shots, for example, 2 shots. It is advantageous at the laser light irradiation to heat the substrate to a temperature of about 200 to 450° C. In this laser annealing step, since nickel is dispersed in the previously crystallized region, recrystallization easily proceeds by the laser light irradiation. Therefore, impurity regions 217 to 219 are easily activated. Activation of the impurities may be conducted by the RTA method is place of the laser annealing steps (FIG. 6E).

Figure 6F:
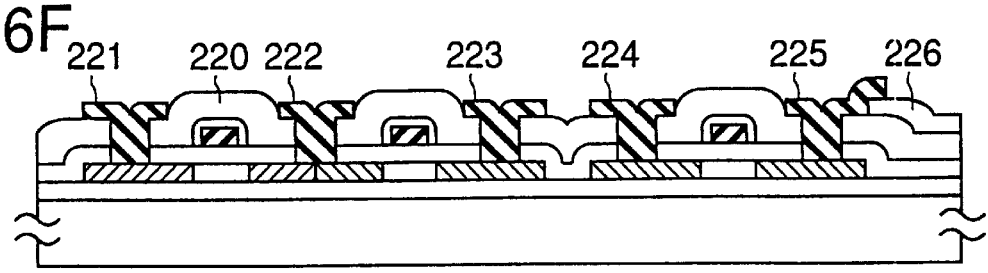

A silicon oxide film 220 having a thickness of 6,000 Å is formed as an interlayer insulating material by a plasma CVD method. Further, an ITO film having a thickness of 500 Å is formed by a sputtering method, and patterning is performed to form a pixel electrode 226. Furthermore, contact holes are formed in the interlayer insulating material 220, and wiring/electrodes 221 to 225 of TFT are formed by a metallic material such as a multilayer film of titanium nitride and aluminum. Finally, annealing is conducted at 350° C. for 30 minutes in a hydrogen atmosphere of 1 atm to complete a TFT circuit (FIG. 6F).

[Embodiment 3]

Figure 7A:
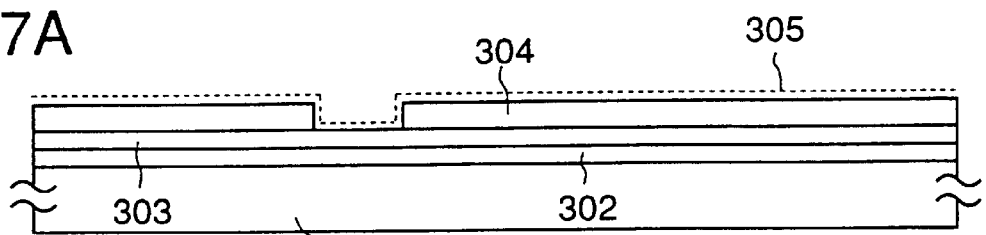
FIGS. 7A to 7F are views showing further manufacturing steps according to the present invention.

FIGS. 7A to 7F are views showing the other manufacturing steps (sectional views) according to this embodiment. As shown in FIG. 7A, a base film 302 of silicon oxide having a thickness of 2,000 Å is formed on a substrate (Corning 7059) 301 by a plasma CVD method using tetraothorysilane (TEOS) and oxygen as raw materials. After formation of the base film 302, the substrate 301 is annealed at 620 to 660° C. for 1 to 4 hours. The substrate is gradually cooled at a rate of 0.1 to 1.0° C./min, preferably 0.1 to 0.3° C./min, and when the temperature reaches 450 to 590° C., the substrate is taken out of a chamber.

An amorphous silicon film 303 having a thickness of 300 to 1,200 Å, for example, 1,000 Å, is formed by a plasma CVD method. A nickel film 305 having a thickness of 20 to 50 Å is formed by a sputtering method using a mask 304 of silicon oxide having a thickness of 1,000 to 3,000 Å, for example, 2,000 Å. The nickel film may not be a continuous film.

Figure 7B:
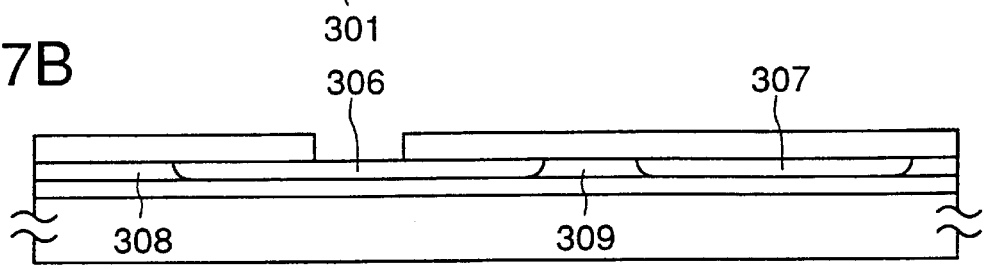

Thermal annealing is conducted at 500 to 620° C., for example, 600° C., for 4 hours in a nitrogen atmosphere to crystallize the silicon film 303. The crystal growth proceeds in the direction parallel to the substrate from the region at which nickel and the silicon film are contacted, as the starting position. In FIG. 7B, regions 306 and 307 are regions crystallized by this step, and regions 308 and 309 are amorphous silicon regions.

Figure 7C:
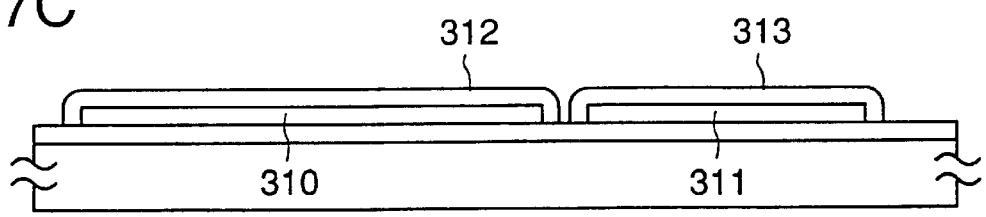

The silicon film 303 is subjected to patterning to form island-like active layer regions 310 (complementary type circuit region) and 311 (pixel transistor region) (FIG. 7C). Etching of the active layers is conducted by an RIE method having an anisotropy in the vertical direction.

The substrate is placed in an oxygen atmosphere containing 10% of steam at 550 to 650° C., typically 600° C. for 3 to 5 hours under 1 atm, whereby the surface of the active layer is oxidized at a thickness of 200 to 800 Å, typically 500 Å, thereby forming silicon oxide layers 312 and 313. A pyrogenic oxidation method (hydrogen:oxygen=1.8 to 1.0:1 in volume ratio) is effective for the formation of this silicon oxide layer. The formed silicon oxide layers 312 and 313 have a thickness of 400 to 1,600 Å, 1,000 Å in this embodiment. After formation of the silicon oxide layer, annealing is conducted at 600° C. for 1 hour in a dinitrogen oxide atmosphere of 1 atm thereby removing hydrogen in the silicon oxide layer.

Figure 7D:
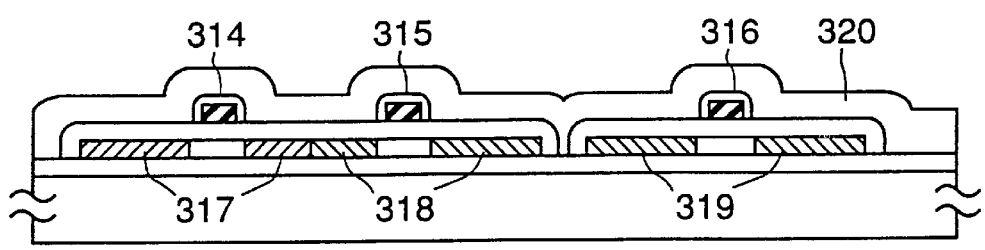

An aluminum film (containing 0.1 to 2% of scandium) having a thickness of 3,000 to 8,000 Å, for example, 6,000 Å, is formed by a sputtering method. The aluminum film is subjected to patterning to form gate electrodes 314 to 316 (FIG. 7D). Further, anodization is conducted by passing a current through the gate electrodes in an electrolyte in the same manner as in Embodiment 2 to form an aluminum oxide film having a thickness of 1,000 to 3,000 Å, 2,000 Å in this embodiment, on the upper and side surface of the gate electrodes.

Impurities for providing P or N conductive type in self-alignment are added to the active layer region (source/drain, channel region) by an ion doping method (plasma doping method) using a gate electrode portion (the gate electrode and its peripheral oxide layer) as a mask. Phosphine ($PH_3$) and diborane ($B_2H_6$) are used as a doping gas. An accelerating voltage is 60 to 90 kV, for example, 80 kV where phosphine is used, and is 40 to 80 kV, for example, 65 kV, where diborane is used. The dose is $1\times10^{15}$ to $8\times10^{15}$ $cm^{-2}$, and for example, phosphorus is $5\times10^{15}$ $cm^{-2}$ and boron is $2\times10^{15}$ $cm^{-2}$. In doping, by covering one region with a photoresist, the respective elements can selectively be doped in the other regions. As a result, N type impurity regions 318 and 319, and P type impurity region 317 are formed, whereby a region of a P channel type TFT (PTFT) and an N channel type TFT (NTFT) can be formed.

Annealing is conducted by a laser light irradiation to activate the impurities ion implanted. KrF excimer laser (wavelength: 248 nm, pulse duration: 20 nsec) is used, but the other lasers may be used. Irradiation conditions of the laser light are that an energy density is 200 to 400 $mJ/cm^2$, for example, 250 $mJ/cm^2$, and the number of shots per portion is 2 to 10 shots, for example, 2 shots. It is advantageous at the irradiation of this laser light to heat the substrate to a temperature of about 200 to 450° C. In this laser annealing step, since nickel is diffused in the previously crystallized region, recrystallization easily proceeds by this laser light irradiation. Therefore, the impurity regions 317 to 319 are crystallized easily.

A silicon oxide coating film 320 is formed by a plasma CVD method. It is import for the film 320 to have an excellent covering property to the side surface of the gate electrode. The film 320 has a thickness of 0.5 to 1 $\mu$m, for example, 0.7 $\mu$m.

Figure 7E:
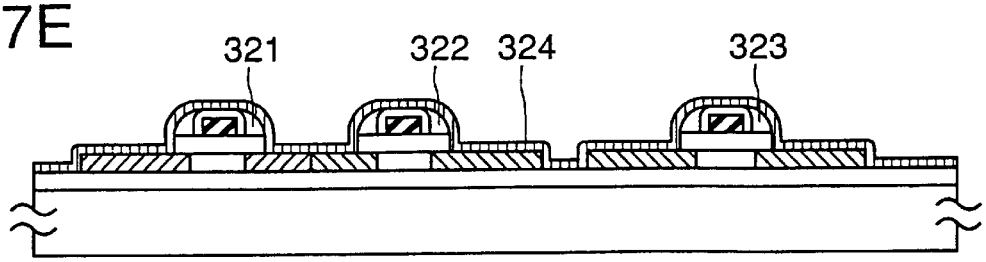

This insulating coating film 320 is subjected to anisotropic etching (selective etching to only a vertical direction) by a means such as a dry etching. As a result, a surface of the source/drain region is exposed, and nearly triangular insulating materials 321, 322 and 323 remain on the side surface of the respective gate electrodes (containing the peripheral anodized layer) (FIG. 7E).

Sizes of the insulating materials 321 to 323, particularly the width, are determined by the thickness of the silicon oxide coating film 320 previously formed, the etching conditions and the height of the gate electrode (containing the peripheral anodized layer). The shape of the insulating material obtained is not limited to a triangular shape, and varies depending on a step coverage or a thickness of the silicon oxide film 320. Where the film 320 has a small thickness, the insulating material has a square shape.

A titanium film 324 having a thickness of 5 to 50 nm is formed by a sputtering method. Molybdenum, tungsten, platinum, palladium or the like may also be used.

After formation of the titanium film 324, annealing is conducted at 200 to 650° C., preferably at 400 to 500° C., to react the titanium film and silicon in the source/drain region, whereby silicide layers 325, 326 and 327 are formed in the source/drain region.

Figure 7F:
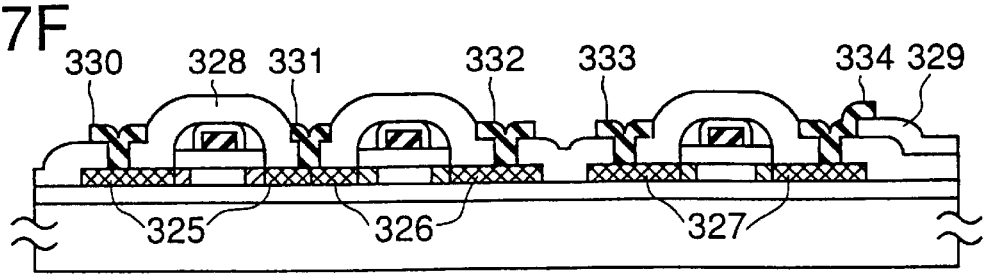

Unreacted titanium film (mainly silicon oxide, or film deposited on the anodized layer) is etched. Further, a silicon oxide layer having a thickness of 6,000 Å is formed as an interlayer insulating material 328 by CVD method. Furthermore, a ITO film having a thickness of 500 to 1,000 Å is deposited by a sputtering method, and subjected to patterning to form a pixel electrode 329. As shown in FIG. 7F, contact holes are formed in the source/drain region of TFT, and a multilayer film of titanium nitride and aluminum are deposited. Patterning is conducted to form wiring/electrodes 330 to 334. Titanium nitride and aluminum have a thickness of 800 Å and 5,000 Å, respectively. Finally, annealing is conducted at 350° C. for 30 minutes in a hydrogen atmosphere of 1 atm to complete a TFT circuit.

If the methods shown in the above embodiments are used in, for example, manufacturing of an active matrix type liquid crystal display, TFT of the peripheral circuit portion is constituted of a crystalline silicon film in which crystals are grown in a direction parallel to the carrier-flow (carrier moving direction), and TFT of the pixel portion is constituted by a crystalline silicon film constituted in a direction vertical to the carrier-flow (carrier moving direction). As a result, TFT which conducts a high speed operation is obtained in the peripheral circuit portion, and TFT which has a small off-current value required for a change retention is obtained in the pixel portion. Thus, in a semiconductor circuit which is required to form TFT having different characteristics on the same substrate, TFT having characteristics which meet the respective requirements are simultaneously formed by merely changing the arrangement direction or the like of TFT. Thus it is possible to improve the characteristics of a circuit as a whole.

What is claimed is:

1. A method of manufacturing a semiconductor device including at least two thin film transistors, comprising the steps of:

disposing a catalyst containing material in contact with a selected region of a semiconductor film on an insulating surface, said catalyst being capable of promoting crystallization of said semiconductor film;

crystallizing said semiconductor film by heating where crystals grow from said selected region;

patterning said semiconductor film into at least two islands after the step of crystallization thereof for said at least two thin film transistors; and forming source and drain regions in said islands, respectively, with a channel region defined therebetween, wherein the step of patterning the semiconductor film is conducted in such a manner that an angle α defined between a direction of said crystals of said semiconductor film extending between said source and drain regions through the channel region and a direction in which carriers of the respective transistors flow is formed, and wherein the width of said respective crystals is generally 0.5 to 3 times the thickness of said semiconductor film.

2. A method according to claim 1 wherein said semiconductor film to be crystallized comprises amorphous silicon.

3. A method according to claim 1 wherein said crystals extend through the channel region completely.

4. A method according to claim 1 wherein said catalyst is selected from Group VIII elements, 3d elements, Au and Ag.

5. A method according to claim 4 wherein said Group VIII elements include Fe, Co, Ni, Ru, Rh, Pd, Os, Ir and Pt, and said 3d elements include Sc, Ti, V, Cr, Mn, Cu and Zn.

6. A method according to claim 1 wherein said angle α is 0°.

7. A method according to claim 1 wherein said angle α is 90°.

8. A method according to claim 1 wherein the thickness of said semiconductor film is 300 Å to 800 Å.

9. A method of manufacturing a semiconductor device including at least two thin film transistors, comprising the steps of;

disposing a catalyst containing material in contact with a selected region of a semiconductor film on an insulating surface, said catalyst being capable of promoting crystallization of said semiconductor film;

crystallizing said semiconductor film in a needle form by heating where crystals grow from said selected region in parallel with said insulating surface;

patterning said semiconductor film into at least two islands after the step of crystallization thereof for said at least two thin film transistors; and forming source and drain regions in said islands, respectively, with a channel region defined therebetween, wherein the step of patterning the semiconductor film is conducted in such a manner that an angle α defined between a direction of said crystals of said semiconductor film extending between said source and drain regions through the channel region and a direction in which carriers of the respective transistors flow is formed, and wherein the width of said respective crystals is generally 0.5 to 3 times the thickness of said semiconductor film.

10. A method according to claim 9 wherein said semiconductor film to be crystallized comprises amorphous silicon.

11. A method according to claim 9 wherein said crystals extend through the channel region completely.

12. A method according to claim 9 wherein said catalyst is selected from Group VIII elements, 3d elements, Au and Ag.

13. A method according to claim 12 wherein said Group VIII elements include Fe, Co, Ni, Ru, Rh, Pd, Os, Ir and Pt, and said 3d elements include Sc, Ti, V, Cr, Mn, Cu and Zn.

14. A method according to claim 9 wherein said angle α is 0°.

15. A method according to claim 9 wherein said angle α is 90°.

16. A method according to claim 9 wherein the thickness of said semiconductor film is 300 Å to 800 Å.

17. A method of manufacturing a semiconductor device comprising the steps of:

preparing a substrate having an active matrix circuit portion and a driver circuit portion on which said active matrix circuit and said driver circuit are to be formed thereon, respectively;

forming a semiconductor film to be crystallized over the substrate;

disposing a catalyst containing material selectively in contact with a first selected region of the semiconductor film over the driver circuit portion, said catalyst being capable of promoting crystallization of said semiconductor film;

crystallizing said semiconductor film by heating where first crystals grow from said first selected region in parallel with a major surface of the substrate over the driver circuit portion and second crystals grow from said second selected region in parallel with a major surface of the substrate over the active matrix portion;

after the step of the crystallization of the semiconductor film, patterning said semiconductor film into at least two islands over said active matrix portion and said driver circuit portion, respectively; and forming source and drain regions in each of said islands with a channel region defined therebetween, wherein the width of said respective first crystals and said respective second crystals are generally 0.5 to 3 times the thickness of said semiconductor film, and wherein an angle α defined between a crystal growth direction of said semiconductor film and a carrier flow direction into said channel region is formed.

18. A method according to claim 17 wherein said catalyst is selected from Group VIII elements, 3d elements, Au and Ag.

19. A method according to claim 18 wherein said Group VIII elements include Fe, Co, Ni, Ru, Rh, Pd, Os, Ir and Pt, and said 3d elements include Sc, Ti, V, Cr, Mn, Cu, and Zn.

20. A method according to claim 17 wherein said angle α is 0° over the driver circuit portion.

21. A method according to claim 17 wherein said angle α is 90° over the active matrix portion.

22. A method according to claim 17 wherein the thickness of said semiconductor film is 300 Å to 800 Å.

23. A method of manufacturing a semiconductor device including at least two thin film transistors, comprising the steps of:

disposing a material in contact with a selected region of a semiconductor film on an insulating surface, said material being capable of promoting crystallization of said semiconductor film;

crystallizing said semiconductor film by heating where crystals grow from said selected region;

patterning said semiconductor film into at least two islands after the step of crystallization thereof for said at least two thin film transistors; and forming source and drain regions in said islands, respectively, with a channel region defined therebetween, wherein said semiconductor film has a thickness of 300 Å to 800 Å, and wherein the width of said respective crystals is generally 0.5 to 3 times said thickness.

24. A method according to claim 23 wherein said semiconductor film to be crystallized comprises amorphous silicon.

25. A method according to claim 23 wherein said crystals extend through the channel region completely.

26. A method according to claim 23 wherein said material is selected from Group VIII elements, 3d elements, Au and Ag.

27. A method according to claim 26 wherein said Group VIII elements include Fe, Co, Ni, Ru, Rh, Pd, Os, Ir and Pt, and said 3d elements include Sc, Ti, V, Cr, Mn, Cu and Zn.

28. A method according to claim 23 further comprising a step of oxidizing said islands by heating in order to form an oxide film at a surface of said islands.

29. A method of manufacturing a semiconductor device including at least two thin film transistors, comprising the steps of:

disposing a material in contact with a selected region of a semiconductor film on an insulating surface, said material being capable of promoting crystallization of said semiconductor film;

crystallizing said semiconductor film in a needle form by heating where crystals grow from said selected region in parallel with said insulating surface;

patterning said semiconductor film into at least two islands after the step of crystallization thereof for said at least two thin film transistors; and forming source and drain regions in said islands, respectively, with a channel region defined therebetween, wherein said semiconductor film has a thickness of 300 Å to 800 Å, and wherein the width of said respective crystals is generally 0.5 to 3 times said thickness.

30. A method according to claim 29 wherein said semiconductor film to be crystallized comprises amorphous silicon.

31. A method according to claim 29 wherein said crystals extend through the channel region completely.

32. A method according to claim 29 wherein said material is selected from Group VIII elements, 3d elements, Au and Ag.

33. A method according to claim 32 wherein said Group VIII elements include Fe, Co, Ni, Ru, Rh, Pd, Os, Ir and Pt, and said 3d elements include Sc, Ti, V, Cr, Mn, Cu and Zn.

34. A method according to claim 29 further comprising a step of oxidizing said islands by heating in order to form an oxide film at a surface of said islands.

35. A method of manufacturing a semiconductor device comprising the steps of:

preparing a substrate having an active matrix circuit portion and a driver circuit portion on which said active matrix circuit and said driver circuit are to be formed thereon, respectively;

forming a semiconductor film to be crystallized over the substrate;

disposing a material selectively in contact with a first selected region of the semiconductor film over the driver circuit portion, said catalyst being capable of promoting crystallization of said semiconductor film;

crystallizing said semiconductor film by heating where first crystals grow from said first selected region in parallel with a major surface of the substrate over the driver circuit portion and second crystals grow from said second selected region in parallel with a major surface of the substrate over the active matrix portion;

after the step of the crystallization of the semiconductor film, patterning said semiconductor film into at least two islands over said active matrix portion and said driver circuit portion, respectively; and forming source and drain regions in each of said islands with a channel region defined therebetween, wherein said semiconductor film has a thickness of 300 Å to 800 Å, and wherein the width of said respective first crystals and the width of said respective second crystals are generally 0.5 to 3 times said thickness.

36. A method according to claim 35 wherein said catalyst is selected from Group VIII elements, 3d elements, Au and Ag.

37. A method according to claim 36 wherein said Group VIII elements include Fe, Co, Ni, Ru, Rh, Pd, Os, Ir and Pt, and said 3d elements include Sc, Ti, V, Cr, Mn, Cu and Zn.

38. A method according to claim 35 further comprising a step of oxidizing said islands by heating in order to form an oxide film at a surface of said islands.

* * * * *

UNITED STATES PATENT AND TRADEMARK OFFICE
CERTIFICATE OF CORRECTION

PATENT NO. : 6,194,254 B1  
APPLICATION NO. : 08/828710  
DATED : February 27, 2001  
INVENTOR(S) : Yasuhiko Takemura It is certified that error appears in the above-identified patent and that said Letters Patent is hereby corrected as shown below:

Title Pg, Item (73) Assignee: "Semiconductor Energy Laboratories Co., Ltd." should be deleted, and replaced with --Semiconductor Energy Laboratory Co., Ltd.--.

Signed and Sealed this

Twenty-sixth Day of May, 2009

JOHN DOLL  
*Acting Director of the United States Patent and Trademark Office*